United States Patent
Gunther et al.

(10) Patent No.: US 7,069,163 B2
(45) Date of Patent: Jun. 27, 2006

(54) DIGITAL SPREAD SPECTRUM METHODS AND APPARATUS FOR TESTING AIRCRAFT WIRING

(75) Inventors: Jacob Gunther, North Logan, UT (US); Deekshit Dosibhatla, Logan, UT (US); Cynthia Furse, Salt Lake City, UT (US)

(73) Assignee: Utah State University, Logan, UT (US)

( * ) Notice: Subject to any disclaimer, the term of this patent is extended or adjusted under 35 U.S.C. 154(b) by 0 days.

(21) Appl. No.: 10/422,445

(22) Filed: Apr. 23, 2003

(65) Prior Publication Data

US 2004/0039976 A1    Feb. 26, 2004

Related U.S. Application Data

(60) Provisional application No. 60/374,901, filed on Apr. 23, 2002.

(51) Int. Cl.
*G01R 27/00*    (2006.01)

(52) U.S. Cl. .................... 702/79; 702/108; 702/189; 702/190

(58) Field of Classification Search ................ 702/108, 702/79, 189, 190; 714/742; 379/21, 399.01; 324/529, 670
See application file for complete search history.

(56) References Cited

U.S. PATENT DOCUMENTS

| | | | | |
|---|---|---|---|---|
| 5,352,984 A | * | 10/1994 | Piesinger | 324/532 |
| 6,144,721 A | * | 11/2000 | Stephens | 379/21 |
| 6,867,600 B1 | | 3/2005 | Iskanius et al. | |

* cited by examiner

*Primary Examiner*—John Barlow
*Assistant Examiner*—Stephen J. Cherry
(74) *Attorney, Agent, or Firm*—Morriss O'Bryant Compagni, PC (57) ABSTRACT

A system and method that utilizes direct sequence spread spectrum signal (DSSS) encoding to enable testing of a live wire, wherein an original data signal is modified and then transmitted along the wire, and a reflected signal is collected and analyzed using correlation techniques to determine characteristics of the live wire, including the location of a fault.

44 Claims, 7 Drawing Sheets

DIGITAL SPREAD SPECTRUM METHODS AND APPARATUS FOR TESTING AIRCRAFT WIRING

CROSS REFERENCE TO RELATED APPLICATIONS

This document is a continuation of, claims priority to, and incorporates by reference all of the subject matter included in the provisional patent application filed on Apr. 23, 2002, and having Ser. No. 60/374,901.

BACKGROUND OF THE INVENTION

1. Field Of the Invention

This invention relates generally to systems and techniques for performing wire and cable testing. More specifically, the invention teaches how to utilize the principles of spread spectrum signal transmission and reception to perform wire and cable testing in aging aircraft where wires and cable can be difficult to access, including determination of wire or cable characteristics such as length and impedance, which is characterized as an open or short circuit condition.

2. Description of Related Art

The benefits of being able to test wires and cables (hereinafter to be referred to as a wire or wires) are many. Some reasons are obvious. For example, wires are used in many pieces of equipment that can have catastrophic results if the equipment fails. A good example of this is an airliner. However, the consequences of non-performance do not have to be so dire in order to see that benefits are still to be gained. For example, wires are used in many locations where they are difficult to reach, such as in the infrastructure of buildings and homes. Essentially, in many cases it is simply not practical to remove wire for testing, especially when this action can cause more damage than it prevents.

Given that the need for wire testing is important and in some cases imperative, the question is how to perform accurate testing that is practical, meaning relatively inexpensive and at a practical cost. The prior art describes various techniques for performing wire testing. These techniques include but are not limited to time domain reflectometry (TDR), frequency domain reflectometry (FDR) and standing wave reflectometry (SWR). TDR is performed by sending an electrical pulse down a wire, and then receiving a reflected pulse. By analyzing the reflected pulse, it is possible to determine wire length, impedance, and the location of open or short circuits.

In standing wave reflectometry (SWR), a signal is transmitted and a reflected signal is received at a directional coupler. The system then measures the magnitude of the reflected signal. A short circuit, an open circuit, and the depth of a null give the same information as TDR. However, this technique is less generally accurate and nearly as expensive.

The process of frequency domain reflectometry (FDR) can be summarized as generating an input signal, splitting the input signal to the wire under test and to a mixer, also sending a reflected input signal to the mixer to thereby generate a mixed signal, removing or ignoring high frequency components, digitizing a remaining component that contains information regarding impedance and length of the wire under test, performing the same steps for several different frequencies, and analyzing the plurality of digitized signals to thereby determine impedance and length of the wire under test.

Aging aircraft wiring often experiences faults during flight that do not occur on the ground. This is because during flight conditions, the conditions of operation are changed. These conditions include different temperatures, levels of humidity, physical and electrical stresses on the wires, etc. These so-called intermittent faults are extremely difficult to manage because they may not be detectable under testing conditions, and thus they are not resolved.

Wires carrying digital data are particularly problematic as it is critical that the testing process not interfere with the data being carried by the wires. Unfortunately, the wire testing apparatus and methods of FDR, TDR and SWR can not be used to perform testing without causing at least some type of interference.

To understand the present invention, it is necessary to now discuss an unrelated concept used in communications. It is observed that Direct Sequence Spread Spectrum (DSSS) is a common method used to improve performance of wireless communication devices. In DSSS, a pseudo-random noise code (PN code) is multiplied by the original digital data signal that is to be transmitted. The result is a newer and higher bandwidth data signal. This higher bandwidth data signal is transmitted via wireless link using methods like BPSK, QPSK, etc. as is known to those skilled in the art. The advantages of this type of transmission include efficient use of bandwidth, noise immunity, resistance to jamming, etc.

What is desired is an improved method of wire fault detection. It would be an improvement over the state of the art if the detection method could be used on live wires, wherein the detection method would not interfere with normal operation of the live wires.

BRIEF SUMMARY OF THE INVENTION

It is an object of the present invention to provide a system and method for measuring impedance of a wire utilizing direct sequence spread spectrum techniques.

It is another object to provide a system and method for wire testing that can be used on a live wire, wherein the testing system and method does not interfere with normal operation of the live wire.

It is another object to provide a system and method for measuring impedance of a wire utilizing Frequency Hopped Spread Spectrum (FHSS).

It is another object to provide a system and method for measuring impedance of a wire under test utilizing Zero Coding.

In a preferred embodiment, the present invention is a system and method that utilizes direct sequence spread spectrum signal (DSSS) encoding to enable testing of a live wire, wherein an original data signal is modified and then transmitted along the wire, and a reflected signal is collected and analyzed using correlation techniques to determine characteristics of the live wire, including the location of a fault.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

The present invention applies the DSSS transmission concept to impedance sensing. As explained above, the length of wires can be determined using reflectometry by measuring impedance using FDR. The present invention is also able to conclude that the length of a wire to a location of a fault can be detected using the same technique. In the present invention, the original data signal is now modified using DSSS techniques to spread the original data signal and make it small, or comparable to noise. This process enables testing to occur on wires that are in use, or live, because the test signals will not interfere with operation of the wire. The test signal is only perceived as noise.

It is noted that the mixing of a test signal with a code can be performed using various methods, including multiplication or addition of the signals.

The original test signal can be gathered or collected using correlation of the PN code, and the "channel" (in this case the wire under test or any other sensor of which the impedance is being measured) can be determined from the propagation delay measured via the PN code.

As explained previously spread spectrum communication techniques provide an efficient communication system in which the transmitted signal can be recovered only at a corresponding receiver. This communication system thus has wide range of applications in military systems, space systems, avionics, cellular telephones, etc., when the signal being transmitted can be subjected to intentional or unintentional jamming. Spread spectrum techniques can be used to combat and suppress the adverse effects of interference due to jamming, interference from other users of the communication channel, and self interference from multi-path propagation. Spread spectrum techniques hide the transmitted signal by spreading the bandwidth and transmitting the signal at low power, so that the unintended or intended listener cannot detect the original signal in the background noise. This technique is so effective that even in the presence of noise and multi-path interference, spread spectrum techniques provide high quality of service for large numbers of simultaneous users.

Superimposition of a pseudo-random pattern (code) on the transmitted signal, spreading the signal over the channel, and sending it to a receiver in the multi-access communications is known as Code Division Multiple Access (CDMA). CDMA has less sensitivity to narrowband noise and spurious signals received from multi-path interference.

The digital data signals used for transmission in aircraft wiring are able to withstand certain levels of noise. The noise immunity of CDMA is shown to be particularly important in the present invention. Based on the above two assumptions, sensing of faulty wiring is possible using CDMA in aircraft wiring.

This document contemplates the use of two different spread spectrum techniques to implement the present invention. In Direct Sequence Spread Spectrum. (DSSS), the input digital data signal is "spread" over a wide frequency range by modifying the input signal with a pseudo-noise digital data code that has a much higher bit rate than the original digital signal. This new modified signal is then transmitted using a digital modulation scheme such as BPSK or QPSK.

The other spread spectrum technique is known as Frequency Hopping Spread Spectrum (FHSS). For FHSS, the same high bit rate pseudo noise code is used to change the carrier frequency throughout the signal transmission time.

Accordingly, the present invention utilizes a pseudo-random noise (PN) sequence (code) that is superimposed onto the original data signal and sent through the wire. The reflected signal is captured and the characteristics are observed. If the original data signal and PN code are independent of each other, it is possible to assume that the cross correlations of the data and PN code can be ignored. Because the data signal is at a relatively low frequency, and the PN code is at relatively higher frequency, the bit rate Tb of the data signal is much greater then the bit rate of the PN code. Accordingly. the auto correlation of the data signal can be assumed as constant. The main advantage of using a PN code is that the PN codes are self-orthogonal and are very easy to generate. Gold codes and Kasami Codes are typical examples.

It is observed that selection of the pseudorandom code is not limited to those methods known to those skilled in the art. Thus, the code selected can be taken from a wide variety of sources, and should not be considered to be limited to just those codes known as "pseudo-random".

Figure 1:
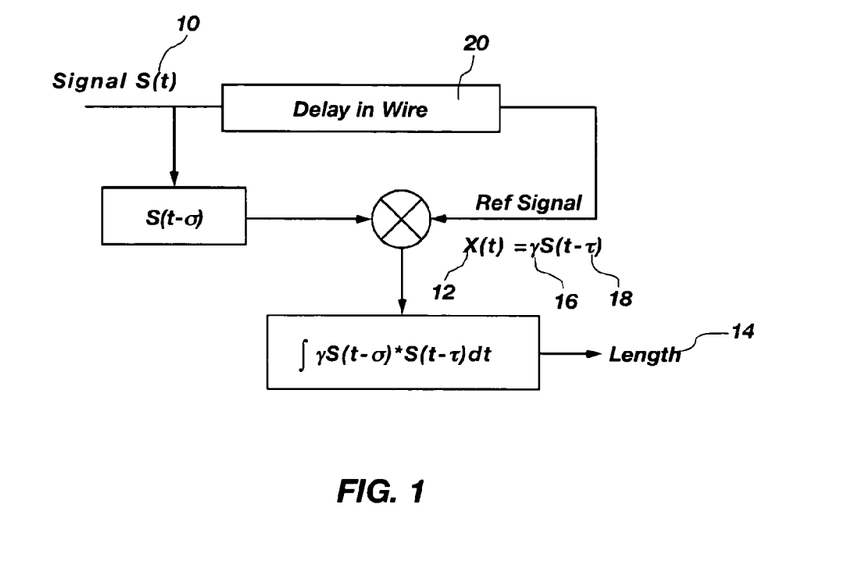
FIG. 1 is a block diagram of the broad implementation of the present invention.

FIG. 1 is provided as an illustration of one embodiment of the present invention. Signal S(t) 10 is transmitted on a wire. If there is no problem in the wire, the signal S(t) will be received at the receiver. If there is a problem in the wire, then the transmission characteristics of the wire will change. This change in transmission characteristic can be perceived as a change in the length 14 of the wire. This information can then be used to identify the location of the problem on the wire.

The preferred embodiment of the present invention can be described as follows. A reflected signal X(t) 12 is an attenuated and time delayed version of signal S(t) 10. Let γ 16 be the attenuation constant and let τ 18 be the delay in the signal. The cross correlation of the original signal S(t) with reflected signal X(t) gives a peak away from the center or zero shift point, which corresponds to the delay in the wire 20. The delay in the wire corresponds to the location of the wire fault.

The principles of the present invention can be explained mathematically. Thus, the following assumptions will be made. Let the bit rate of the Original data signal be Tb, the Bit rate of the PN sequence be Tc, and the time taken for the signals to travel through the wires in both directions be Tw. Also, it will be assumed that Tb>>Tc>Tw. The original data signal can be represented as d(t), and the PN sequence will be represented as s(t).

The mixed signal is expressed as $x(t)=d(t)+s(t)$

The reflected signal is expressed as $r(t)=x(t-\tau)=d(t-\tau)+s(t-\tau)$

The correlation between the mixed signal and reflected signal is thus expressed as:

$$R(T) = E[x(t)r(t+T)];$$
$$= E[x(t)x(t-\tau+T)];$$
$$= E[d(t)d(t-\tau+T)] + E[s(t)s(t-\tau+T)] + E[d(t)s(t-\tau+T)] + E[s(t)d(t-\tau+T)];$$
$$\approx E[d(t)d(t-\tau+T)] + E[s(t)s(t-\tau+T)];$$

Because the original signal and the PN signal are independent, their cross correlations are zero. If the PN sequence is white then the autocorrelation is a delta function. The bit rate of the data signal is very high, and thus the auto correlation appears to be constant if the rise and fall times of the bit are very low. Accordingly, the corresponding delta function will have a relationship with the length of the wire.

From the characteristics of these mixtures and reflected signals, it is possible to determine the length of the wire. It is helpful to also be aware of the characteristics, properties and behavior of the real time data that flows in the aircraft wire.

In the M codes model of the present invention, "M" different PN codes that are relatively prime are used for finding the length of the wire. A repeated PN sequence of length M1 is mixed with the digital data signal and sent through the wire. The cross correlation of the original PN sequence and the reflected PN code gives a peak. Because there are repeated codes present, the exact delay cannot be determined using only one sequence. Thus, another PN sequence of length M2 is mixed with digital data signal and sent through the wire. The cross correlation gives another peak. The superimposition of the cross correlations over the complete signal gives only one match which corresponds to the length of the wire.

Figure 2:
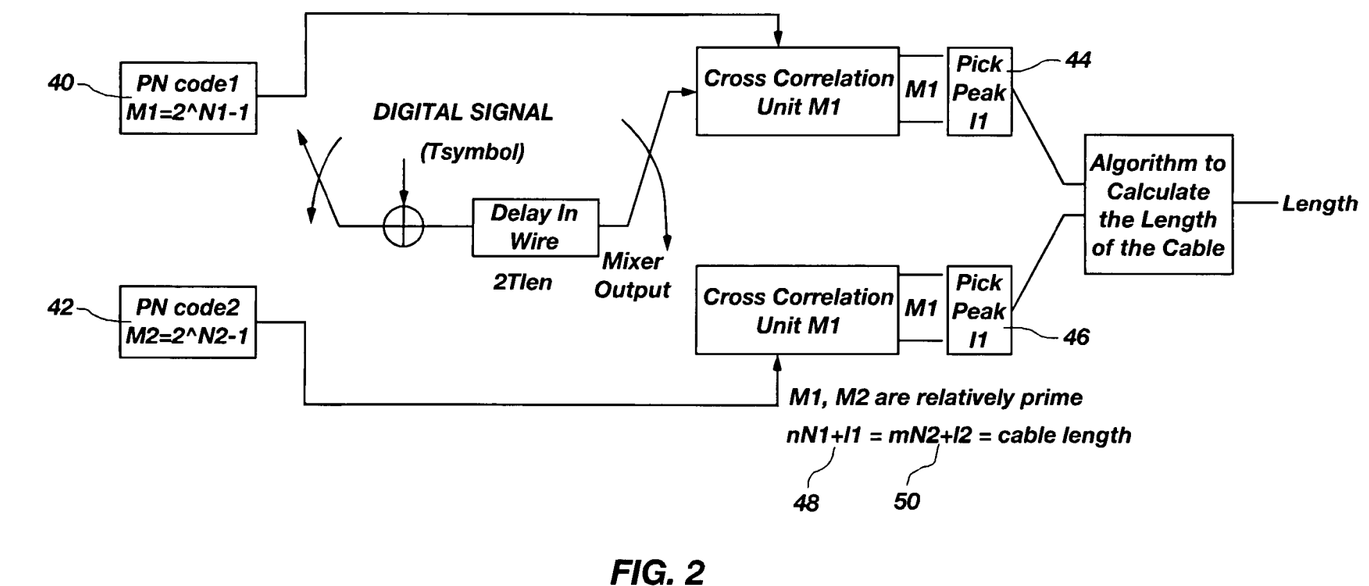
FIG. 2 is a block diagram of one implementation of the present invention.

FIG. 2 is provided as a basic block diagram for this approach. Two different PN codes with lengths M1 40 and M2 42 are used in this example. A simple mathematical expression is given for the calculation of the length of the wire. The peak obtained from the first PN code is at i1 44, and the peak from second PN code is at i2 46. Thus, this can be expressed as:

$nM1+i1$ 48$=mM2+i2$ 50$=$cable length, where $M1=2^{N1}-1$ and $M2=2^{N2}-1$.

In this method, the number of computations is relatively large. Thus, the longer the length of the codes, the greater the number of computations required, and the implementation is more difficult.

Figure 3:
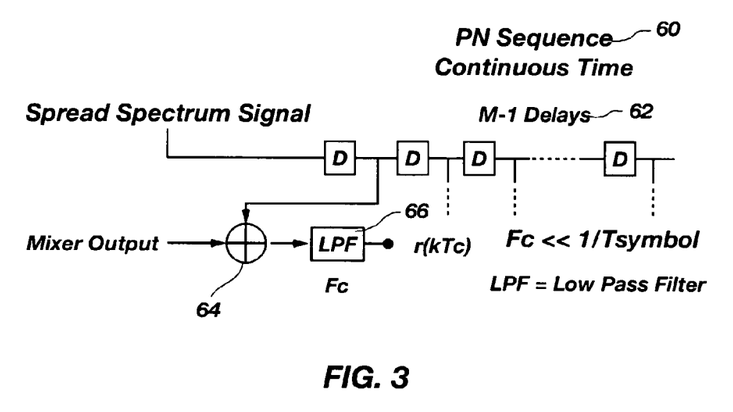
FIG. 3 is a block diagram of a cross correlation technique that can be used in the present invention.

FIG. 3 is an illustration of the cross correlation technique that can be used in the present invention. The original PN sequence 60 is compared with the reflected PN sequence, and the system checks for the match for every delay 62. For good PN sequences there will be a peak when there is a perfect match. For every delay both sequences are mixed 64 and sent through a Low pass Filter 66.

Figure 4:
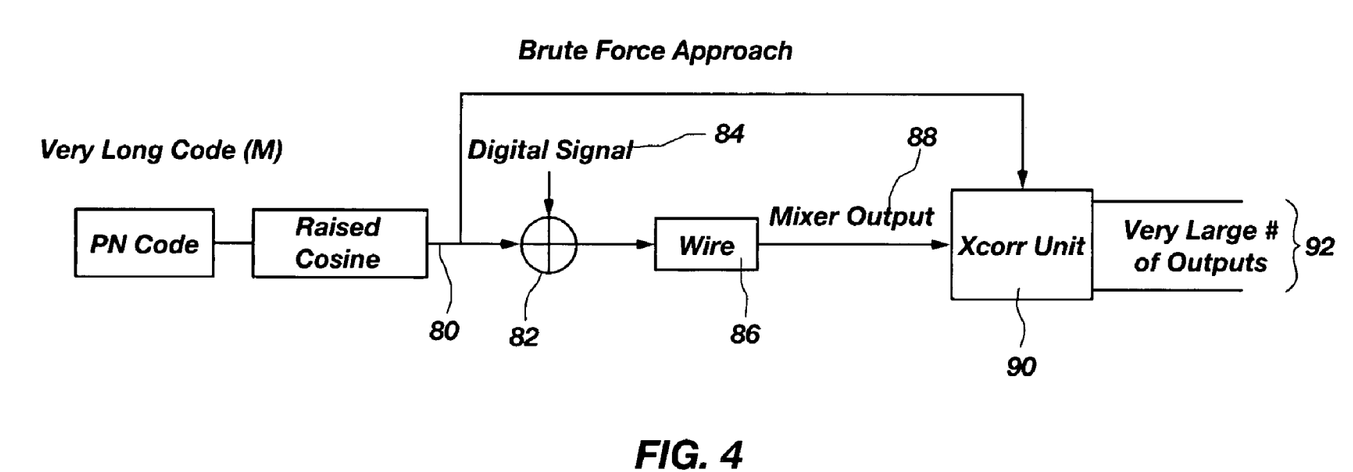
FIG. 4 is a block diagram of a brute force implementation of the present invention.

In a brute force approach solution to the problem shown in FIG. 4, the number of computations is large, and thus the system is more difficult to implement. Raised cosine PN code 80 is generated and is mixed 82 with the digital data signal 84 and sent through the wire 86. The mixture output 88 and original PN code 80 are given to the cross correlation unit 90. The result is a large number of outputs 92, which is complex and difficult.

Figure 5:
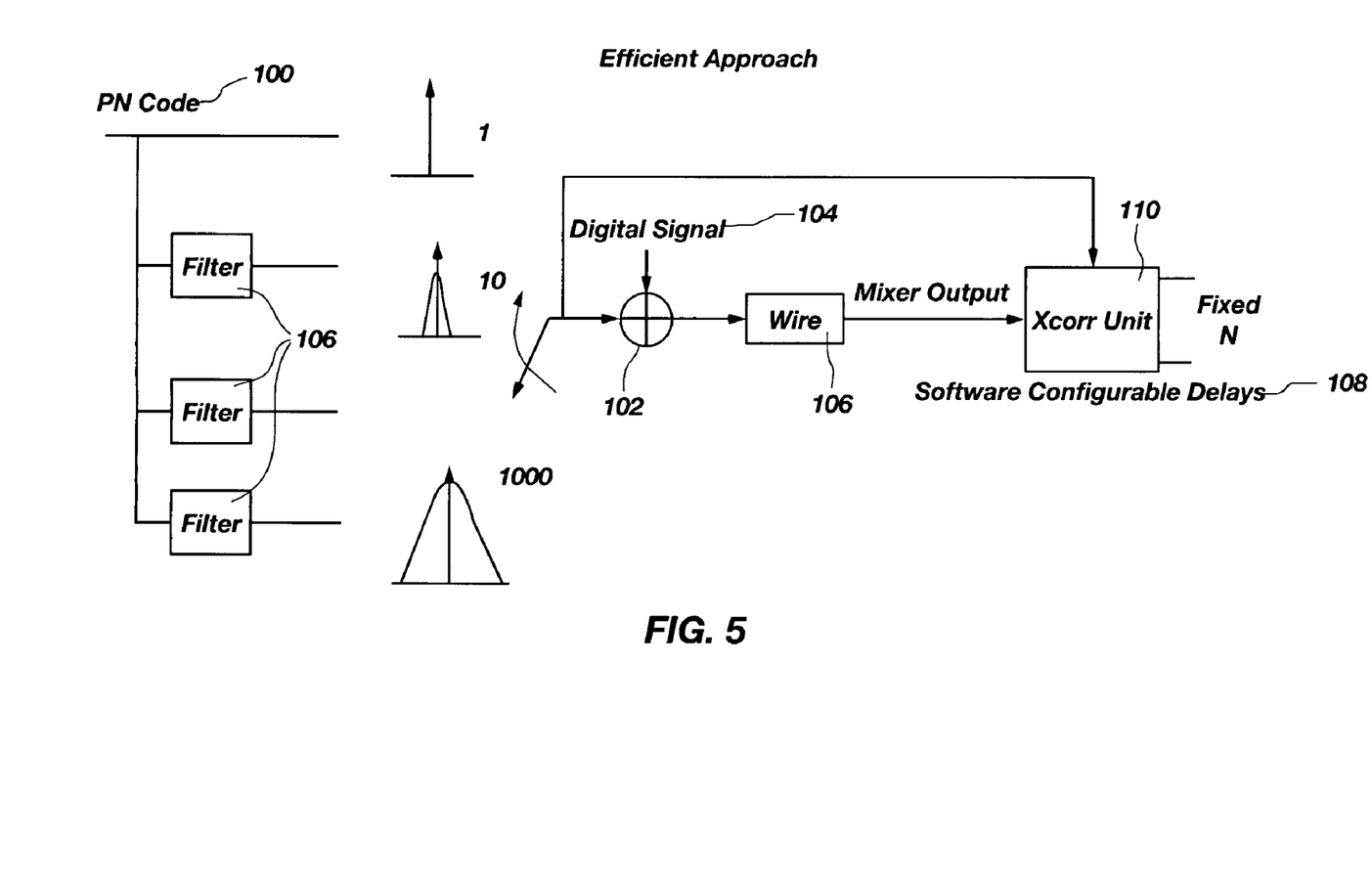
FIG. 5 is a block diagram of a more efficient implementation of the present invention.

A more efficient approach is illustrated in FIG. 5. In this method, the number of computations is reduced. In the first step, the PN code 100 is passed through a low pass filter (LPF), 106, and then mixed with 102 with the digital data signal 104 and sent through the wire 106. Software configurable delays 108 are used in the cross correlation unit 110. A broader correlation is used, wherein correlation for 1000 chips is done once instead of for one chip. Correlation is narrowed to one chip as shown in FIG. 5. In this method, the number of computations decreases rapidly and there is no need to use different PN codes.

It is noted that resolution of the present invention should not be considered to be limited to one chip. Resolution can be obtained that is greater, and thus less than one chip. It is also noted that the methods of the present invention are also not limited to digital implementations, but may also be considered to include analog functions to thereby improve performance.

The number of outputs remains the same for each time through the circuit. If the wire can occupy N chips at one time, then the number of computations in this method are 10*number of digits in N. Thus, as N becomes longer, it is possible to increase resolution with less computations.

Figure 6:
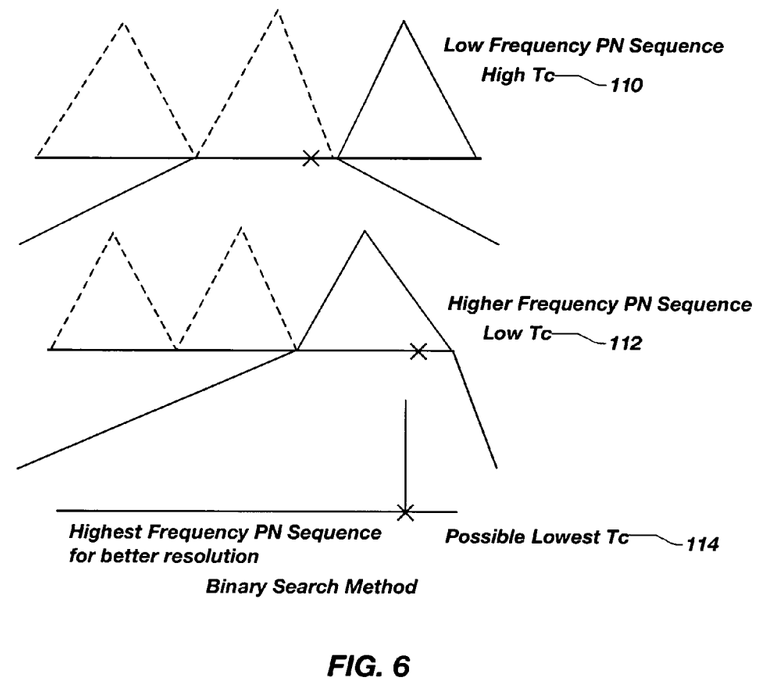
FIG. 6 is an illustration of the binary search method implementation of the present invention.

FIG. 6 illustrates another method of the present invention, known as the binary search method. This method is less complex, easy to implement, and more efficient.

In this approach, different codes are used having the same length. These codes differ in their chip rate. An example is illustrated in FIG. 6. In this example, a 3-bit PN code with high Tc 110 is used and the correlation unit gives the peak that corresponds to the length of the wire. The resolution is relatively poor. Then, a higher frequency 3-bit PN code 112 is used and the correlation gives the peak within the range of the length found by the first PN code. Yet again, another 3-bit code with an even higher frequency 114 is used and the resolution is increased. Thus, the exact position of the fault can be found using this method with even fewer computations. The number of computations required is 3*ln2M.

Figure 7:
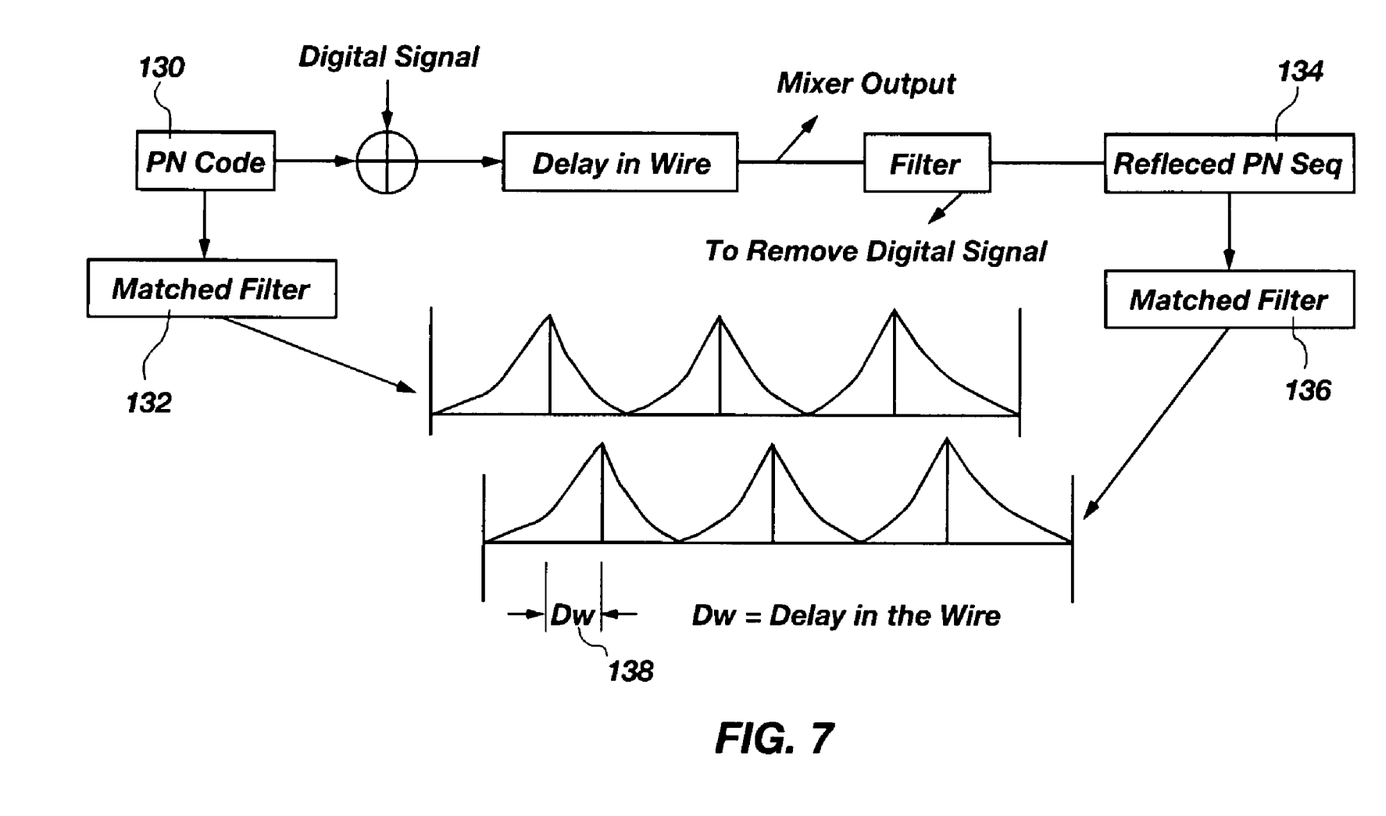
FIG. 7 is a block diagram of a matched filter output implementation of the present invention.

FIG. 7 illustrates the matched filter method. In this method, the original PN code 130 is passed through the matched filter 132 and the reflected PN sequence 134 is also passed through a matched filter 136. The delay in the response of these two matched filters 132, 136 gives the delay of the signal 138 in the wire, which corresponds to the location of the fault, or the length of the wire.

This method efficient and relatively simple to implement. In all these methods, the travel time is determined, and thus the length of the wire. The length versus correlation time of the PN sequence is nearly linear even when significant noise, digital data, or low frequency power is added to the wire under test.

It is noted that one of the main advantages of using spread spectrum techniques is that PN codes are self-orthogonal. Unlike FDR, in these techniques there is no need for filtering the digital data signal from the mixed signal. The hardware is fixed, simple and easy to implement. The location of a fray can be determined within centimeters.

Two related methods of utilizing DSSS to perform impedance measurements are Frequency Hopped Spread Spectrum (FHSS) and Zero Coding, as those terms are understood by those skilled in the art.

The present invention may also have other sensing applications. These sensing applications are where impedance measurements are performed when environmental noise or other signals are present on test wires, sensors, etc. For example, these sensing applications include testing for soil moisture, water level, fluid discrimination, proximity sensing, etc. The invention may also provide a more robust measurement.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A method of determining impedance of a wire under test utilizing direct sequence spread spectrum (DSSS) techniques, said method comprising the steps of:
   (1) coupling the DSSS wire testing system to a connecting end of the wire under test;
   (2) obtaining a pseudo-random noise (PN) code;
   (3) multiplying a test signal by the PN code;
   (4) transmitting the multiplied test signal from the DSSS wire testing system to the wire under test;
   (5) receiving a reflected multiplied test signal from the wire under test; and
   (6) determining a length of the wire under test from the reflected multiplied test signal.

2. The method as defined in claim 1 wherein the step of determining a length of the wire under test from the reflected multiplied test signal further comprises the step of utilizing a propagation delay measured via the PN code.

3. A method of using spread spectrum techniques for wire testing of a live wire, said method comprising the steps of:
   (1) generating a pseudo random code;
   (2) modifying a test signal using the code;
   (3) transmitting the modified test signal on the live wire, wherein the modified test signal has a signal strength that is comparable to noise on the live wire;
   (4) measuring a propagation delay of the modified test signal via the code; and
   (5) determining impedance of the live wire.

4. The method as defined in claim 3 wherein the step of modifying the test signal using the code further comprises the step of multiplying the test signal by the code.

5. The method as defined in claim 3 wherein the step of modifying the test signal using the code further comprises the step of adding the code to the test signal.

6. The method as defined in claim 3 wherein the step of determining impedance of the live wire further comprises the step of using a reflectometry method.

7. The method as defined in claim 6 wherein the step of using a reflectometry method further comprises the step of using frequency domain reflectometry.

8. The method as defined in claim 3 wherein the method further comprises the step of using correlation techniques.

9. The method as defined in claim 8 wherein the method further comprises the step of cross correlating the modified test signal and a reflected modified test signal, to thereby obtain a peak that corresponds to a delay of the modified test signal on the live wire.

10. The method as defined in claim 9 wherein the method further comprises the step of corresponding the delay of the modified test signal on the live wire to a location of a fault on the live wire.

11. The method as defined in claim 3 wherein the method further comprises the step of using direct sequence spread spectrum (DSSS) to modify the test signal.

12. The method as defined in claim 11 wherein the method further comprises the step of modifying the test signal with the code, wherein the code has a higher bit rate than the test signal.

13. The method as defined in claim 12 wherein the method further comprises the step of transmitting the modified test signal using a digital modulation scheme.

14. The method as defined in claim 13 wherein the method further comprises the step of transmitting the modified test signal using a digital modulation scheme selected from the group of digital modulation schemes comprised of BPSK and QPSK.

15. The method as defined in claim 3 wherein the method further comprises the step of analyzing a reflected modified test signal to determine wire impedance.

16. The method as defined in claim 3 wherein the method further comprises the step of selecting the code to be independent of the test signal, thereby ignoring cross correlations of any signals and the code on the live wire.

17. The method as defined in claim 3 wherein the method further comprises the step of using a plurality of prime codes.

18. The method as defined in claim 17 wherein the method further comprises the steps of:
   (1) modifying a first test signal with a first repeated code;
   (2) transmitting the modified first test signal with the first repeated code;
   (3) obtaining a first peak from a cross correlation of the modified first test signal, and a reflected modified first test signal;
   (4) modifying a second test signal with a different repeated code;
   (5) transmitting the modified second test signal with the different repeated code;
   (6) obtaining a second peak from a cross correlation of the modified second test signal, and a reflected modified second test signal; and
   (7) superpositioning the first peak and the second peak to obtain the length of the wire.

19. The method as defined in claim 18 wherein the first repeated code is of length M1, wherein M1 is an integer greater than zero.

20. The method as defined in claim 18 wherein the first repeated code is of length M2, wherein M2 is an integer greater than zero.

21. The method as defined in claim 3 wherein the method further comprises the steps of:
   (1) passing the code through a low pass filter;
   (2) mixing the filtered code with a test signal;
   (3) providing delays in a cross correlation unit; and
   (4) performing correlation for a plurality of sensors.

22. The method as defined in claim 3 wherein the method further comprises the steps of:
   (1) using a plurality of different code having equal length; and
   (2) changing a bit rate of the plurality of different codes to thereby perform a binary search method to determine length of the live wire.

23. The method as defined in claim 3 wherein the method further comprises the steps of:
   (1) passing the code through a first matched filter;
   (2) passing a reflected code through a second matched filter;

(3) determining a delay in response between the first matched filter and the second matched filter; and (4) corresponding the delay to the length of the wire.

24. A method of using spread spectrum techniques for testing of a live wire, said method comprising the steps of:
(1) generating a pseudo random code;
(2) modifying a test signal using the pseudo random code;
(3) spreading out the test signal for transmission on a live wire such that the spread test signal is comparable in strength to noise on the live wire;
(4) transmitting the spread test signal on the live wire;
(5) measuring a propagation delay of the spread test signal; and
(6) determining impedance of the live wire.

25. The method as defined in claim 24 wherein the step of modifying the test signal using the code further comprises the step of multiplying the test signal by the code.

26. The method as defined in claim 24 wherein the step of modifying the test signal using the pseudo random code further comprises the step of adding the pseudo random code to the test signal.

27. The method as defined in claim 24 wherein the step of determining impedance of the live wire further comprises the step of using a reflectometry method.

28. The method as defined in claim 27 wherein the step of using a reflectometry method further comprises the step of using frequency domain reflectometry.

29. The method as defined in claim 24 wherein the method further comprises the step of using correlation techniques.

30. The method as defined in claim 29 wherein the method further comprises the step of cross correlating the modified test signal and a reflected modified test signal, to thereby obtain a peak that corresponds to a delay of the modified test signal on the live wire.

31. The method as defined in claim 30 wherein the method further comprises the step of corresponding the delay of the modified test signal on the live wire to a location of a fault on the live wire.

32. The method as defined in claim 24 wherein the method further comprises the step of using direct sequence spread spectrum (DSSS) to modify the test signal.

33. The method as defined in claim 32 wherein the method further comprises the step of modifying the test signal with the code, wherein the code has a higher bit rate than the test signal.

34. The method as defined in claim 33 wherein the method further comprises the step of transmitting the modified test signal using a digital modulation scheme.

35. The method as defined in claim 34 wherein the method further comprises the step of transmitting the modified test signal using a digital modulation scheme selected from the group of digital modulation schemes comprised of BPSK and QPSK.

36. The method as defined in claim 24 wherein the method further comprises the step of analyzing a reflected modified test signal to determine wire impedance.

37. The method as defined in claim 24 wherein the method further comprises the step of selecting the code to be independent of the test signal, thereby ignoring cross correlations of any signals and the code on the live wire.

38. The method as defined in claim 24 wherein the method further comprises the step of using a plurality of prime codes.

39. The method as defined in claim 38 wherein the method further comprises the steps of:
(1) modifying a first test signal with a first repeated code;
(2) transmitting the modified first test signal with the first repeated code;
(3) obtaining a first peak from a cross correlation of the modified first test signal, and a reflected modified first test signal;
(4) modifying a second test signal with a different repeated code;
(5) transmitting the modified second test signal with the different repeated code;
(6) obtaining a second peak from a cross correlation of the modified second test signal, and a reflected modified second test signal; and
(7) superpositioning the first peak and the second peak to obtain the length of the wire.

40. The method as defined in claim 39 wherein the first repeated code is of length M1, wherein M1 is an integer greater than zero.

41. The method as defined in claim 39 wherein the first repeated code is of length M2, wherein M2 is an integer greater than zero.

42. The method as defined in claim 24 wherein the method further comprises the steps of:
(1) passing the code through a low pass filter;
(2) mixing the filtered code with a test signal;
(3) providing delays in a cross correlation unit; and
(4) performing correlation for a plurality of sensors.

43. The method as defined in claim 24 wherein the method further comprises the steps of:
(1) using a plurality of different code having equal length; and
(2) changing a bit rate of the plurality of different codes to thereby perform a binary search method to determine length of the live wire.

44. The method as defined in claim 24 wherein the method further comprises the steps of:
(1) passing the code through a first matched filter;
(2) passing a reflected code through a second matched filter;
(3) determining a delay in response between the first matched filter and the second matched filter; and corresponding the delay to the length of the wire.

* * * * *